United States Patent
Richter et al.

(10) Patent No.: US 10,033,383 B1
(45) Date of Patent: Jul. 24, 2018

(54) PROGRAMMABLE LOGIC ELEMENTS AND METHODS OF OPERATING THE SAME

(71) Applicant: GLOBALFOUNDRIES Inc., Grand Cayman (KY)

(72) Inventors: Ralf Richter, Radebeul (DE); Stefan Duenkel, Dresden (DE); Sven Beyer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/463,316

(22) Filed: Mar. 20, 2017

(51) Int. Cl.
*H03K 19/00* (2006.01)
*H03K 19/0185* (2006.01)
*H01L 29/78* (2006.01)

(52) U.S. Cl.
CPC ... *H03K 19/0013* (2013.01); *H01L 29/78391* (2014.09); *H03K 19/018585* (2013.01)

(58) Field of Classification Search
CPC ........ H03K 19/0013; H03K 19/018585; H01L 29/78391
USPC ............................................... 326/37–41, 47
See application file for complete search history.

(56) References Cited

U.S. PATENT DOCUMENTS

| | | | | |
|---|---|---|---|---|
| 5,361,224 A | * | 11/1994 | Takasu | G11C 11/22 365/117 |
| 5,923,184 A | * | 7/1999 | Ooms | H03K 19/08 326/121 |
| 6,314,016 B1 | * | 11/2001 | Takasu | G11C 11/22 326/49 |
| 6,498,742 B2 | * | 12/2002 | Chu | G11C 11/22 257/E29.272 |
| 6,847,071 B2 | * | 1/2005 | Ueda | G11C 27/005 257/295 |
| 7,259,981 B1 | | 8/2007 | MacLeod | |
| 8,350,602 B2 | * | 1/2013 | Hong | B82Y 10/00 257/322 |
| 2007/0228432 A1 | * | 10/2007 | Ishihara | G11C 11/22 257/295 |
| 2013/0313524 A1 | * | 11/2013 | De Micheli | H01L 29/775 257/29 |

* cited by examiner

*Primary Examiner* — Dylan White
(74) *Attorney, Agent, or Firm* — Amerson Law Firm, PLLC

(57) ABSTRACT

In illustrative embodiments disclosed herein, a logic element may be provided on the basis of a non-volatile storage mechanism, such as ferroelectric transistor elements, wherein the functional behavior may be adjusted or programmed on the basis of a shift of threshold voltages. To this end, a P-type transistor element and an N-type transistor element may be connected in parallel, while a ferroelectric material may be used so as to establish a first polarization state resulting in a first functional behavior and a second polarization state resulting in a second different functional behavior. For example, the logic element may enable a switching between P-type transistor behavior and N-type transistor behavior depending on the polarization state.

18 Claims, 4 Drawing Sheets

PROGRAMMABLE LOGIC ELEMENTS AND METHODS OF OPERATING THE SAME

BACKGROUND

1. Field of the Disclosure

Generally, the present disclosure relates to circuit elements, such as transistors, that may be used in analog or digital circuits, wherein the functional behavior of at least some of the logic elements or a block of logic elements may be adjustable or programmable in a static and/or dynamic manner.

2. Description of the Related Art

Significant efforts have been made in the field of microelectronics in order to steadily enhance performance with respect to signal processing, while at the same time overall size and power consumption have been reduced. Currently, powerful logic devices, such as microprocessors and the like, may be formed on the basis of sophisticated CMOS techniques, in which P-type transistor elements and N-type transistor elements represent the backbone of high performance low power semiconductor devices. Due to the ever decreasing dimensions of the transistor elements, more and more functions may be implemented into a single semiconductor chip, thereby even providing the capability of producing complete systems on a single chip. On the other hand, power consumption of complex logic circuits may steadily be reduced, for instance, by reducing the operating voltage of sophisticated transistor elements, however, without significantly negatively affecting switching speeds of these devices, so that significant computational power may be implemented even into low power applications, possibly in combination with additional resources, such as sensor elements, analog-to-digital converters and the like. In this manner, highly complex signal processing capabilities may be provided even for low cost systems manufactured on the basis of complementary transistor elements.

Although highly complex central processing units have been developed over the recent years, thereby providing the possibility of implementing nearly any desired computational power for many types of applications, there is still an ongoing tendency to further reduce overall computational time, while also reducing power consumption. These two aspects may, for a given technology node, not be optimized simultaneously, since a reduced switching time of transistors (and thus increased operating speed) may be typically associated with increased static and dynamic losses, thereby increasing power consumption.

For example, if sophisticated computational power is required for a specifically defined computation in combination with reduced overall power consumption, an application-specific integrated circuit may be designed so as to provide an appropriately configured hardware that is specifically adapted to the task at hand. Although the provision of a specifically designed integrated circuit may resolve the conflict between high performance and lower power consumption, there is inevitably a significant reduction of flexibility associated with such a specifically designed integrated circuit, since the special design may substantially not allow a re-modification of the specifically designed hardware of the circuit at a later stage. In order to circumvent the problem of reduced flexibility of specifically designed hardware configurations that may be optimized with respect to a certain application, other concepts have been developed over recent decades in order to allow a reconfiguration of the hardware of a circuit when adaptation to modified circumstances is required. Such conventional reconfigurable computing logic circuits include field programmable gate arrays (FPGA), which basically provide for superior flexibility in configuring a respective hardware configuration by appropriately connecting respective basic logic blocks with each other in order to comply with a specific application. In particular, in the field of research and development, a significant reduction in costs may be achieved by making use of field programmable gate arrays in order to manufacture certain prototypes or products at a relatively low number. Generally, the market share of field programmable gate arrays is significantly less compared to, for instance, application-specific integrated circuits, since, despite the enhanced flexibility of field programmable gate arrays, reduced power efficiency and density of computational resources is associated with programmable gate arrays as a respective currently established configuration has to be stored and implemented in a corresponding memory area which, for non-volatile applications, may require a respective non-volatile storage device to be implemented into the circuitry of the programmable gate array.

Currently, great efforts are being made to combine the advantages of reconfigurable hardware in combination with conventional logic circuits and non-volatile memories in order to provide superior semiconductor devices allowing a specific adaptation of hardware areas, for instance, of certain logic blocks, optimized for specific logic operations, however, without requiring the significant overhead in pre-programming the required hardware configurations into any non-volatile memories so as to enable the establishment of the desired hardware configuration upon repowering a specific device.

In some proposed strategies, non-volatile storage elements, such as ferroelectric transistors, storage transistors on the basis of charge carrier injection into gate electrodes and the like, may be used to establish a non-volatile storage device, on the basis of which a respective reconfiguration of hardware may be implemented. Although such strategies are very promising for enhancing performance of respective non-volatile storage devices, thereby also enhancing overall performance of respective systems, including a reconfigurable logic area, it appears, however, that further enhanced flexibility and/or logic density in the reconfigurable portion of respective semiconductor devices may be required in order to impart increased economic importance to these devices.

In view of the situation described above, the present disclosure relates to techniques for providing reconfigurable or programmable logic devices, while avoiding, or at least reducing, the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is based on the concept of providing non-volatile function at the level of the basic logic element itself in order to enhance logic density and/or power consumption and/or flexibility in the field of reconfigurable or programmable logic devices. To this end, a logic element having basically the functional behavior of a transistor element may be provided so as to allow an adjustment or shift of device characteristics in order to provide the possibility for programming the signal response or logic response of a single logic element, advantageously in a non-volatile manner, thereby achieving a significantly higher degree of "granularity" for adapting the overall logic behavior of a corresponding combined block of logic elements. In illustrative embodiments, a corresponding programmable or adjustable logic element may be established on the basis of a ferroelectric transistor concept in order to implement the non-volatile nature into individual logic elements. By exploiting the ferroelectric nature of a respective transistor element, a reconfiguration or programming of a respective individual logic element may be established within relatively short time intervals, thereby providing for the possibility of a dynamic adaptation of the basic hardware configuration of a logic block, while the "static" nature of the programming may be maintained on the basis of the non-volatile ferroelectric state of a respective transistor element, which is substantially not affected during the normal transistor operation. Consequently, a high degree of flexibility may be achieved by providing programmable or adjustable device characteristics on a single logic element basis, while a moderately high logic density may also be accomplished.

According to one illustrative embodiment of the present disclosure, a programmable logic element includes a P-type ferroelectric transistor element having a gate terminal and first and second channel terminals. The programmable logic element further includes an N-type ferroelectric transistor element having a gate terminal and first and second channel terminals, wherein the gate terminal, the first channel terminal and the second channel terminal of the P-type ferroelectric transistor are electrically connected in parallel with the gate terminal, the first channel terminal and the second channel terminal of the N-type ferroelectric transistor element, respectively.

According to a further illustrative embodiment of the present disclosure, a transistor-type circuit element in a semiconductor device is provided. The transistor-type circuit element includes a channel region connected at one end thereof to a first channel terminal and connected at a second end thereof to a second channel terminal. Furthermore, the transistor-type circuit element includes a control electrode formed so as to enable control of current flow through the channel region. Additionally, the transistor-type circuit element is configured to have a threshold voltage that is shiftable to a first value resulting in a substantially P-type characteristic of a current flow behavior in the channel region and is also shiftable to a second value resulting in a substantially N-type characteristic of the current flow behavior.

According to a still further illustrative embodiment of the present disclosure, a method of operating a logic element is provided. The method includes connecting a P-type transistor element and an N-type transistor element in parallel. Moreover, the method includes operating the parallel-connected P-type transistor element and N-type transistor element on the basis of a common control signal. Additionally, the method includes adjusting a current characteristic of the parallel-connected P-type transistor element and N-type transistor element by commonly shifting a first threshold voltage of the P-type transistor element and a second threshold voltage of the N-type transistor element.

BRIEF DESCRIPTION OF THE DRAWINGS

The disclosure may be understood by reference to the following description taken in conjunction with the accompanying drawings, in which like reference numerals identify like elements, and in which.

Figure 1A:
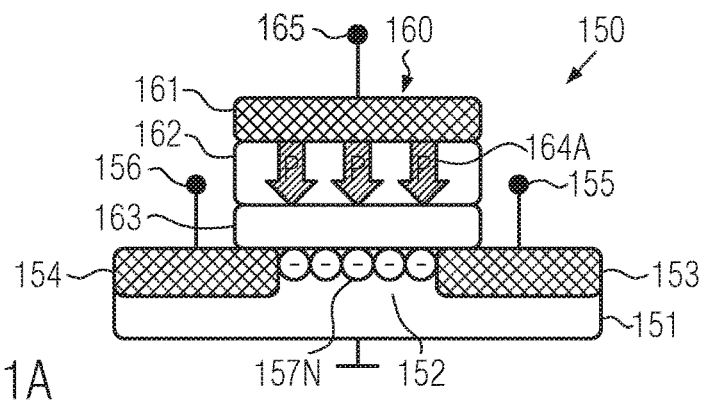
FIG. 1A illustrates, in a very schematic manner, a cross-sectional view of a ferroelectric transistor element, for instance, in an N-type configuration, in a specific polarized state.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure is based on the concept that superior flexibility in configuring a hardware portion of a semiconductor device may be achieved by providing programmable or adjustable logic elements, which may then be combined to appropriate blocks in order to provide the desired functional behavior. In this context, it should be appreciated that a logic element as used herein is to be understood as a basic active circuit element, having a substantially transistor-like functional behavior which, when operated in a substantially switched operational mode, may therefore represent a binary logic element having basically two distinct logic states. On the other hand, when the logic element is to be operated in a nonswitched operational mode, for instance, in an analog portion of a circuit, this element may, nevertheless, be called a logic element, for instance, comparable to a field effect transistor operated in the linear range, wherein certain functions, such as analog computation and the like, may also be considered as a logic operation performed by the logic element of the present disclosure.

Irrespective of the operational mode of the logic element, i.e., switched operational mode or analog operational mode, the functional behavior of the logic element may, based on the concept of the present disclosure, be programmed or adjusted in a non-volatile manner, i.e., the programmed or adjusted functional behavior may remain substantially the same, even after shutting off the logic element and repowering the same at a later stage. Furthermore, a "transistor-like" functional behavior is to be understood in the context of field effect transistors, which typically have a channel region, the conductive behavior of which may be significantly affected by at least one control terminal, typically referred to as the gate electrode, wherein the respective channel region is contacted by the respective terminals or electrode regions, typically referred to as drain and source regions, wherein frequently a substantially symmetric transistor configuration is used. Therefore the terms "drain" and "source" may be merely defined by the respective functional behavior or connection to a certain reference voltage. Based on this definition, the logic element of the present disclosure is to be understood as a logic element having a channel region terminated by respective terminals, which may, for instance, be referred to as respective channel terminals or as drain and source regions, if appropriate. In illustrative embodiments disclosed herein, the functional behavior of the logic element may be programmed so as to shift the transistor-like behavior on the basis of a non-volatile mechanism, for instance, in some illustrative embodiments, the polarization of a respective material may be changed in a non-volatile manner, so as to finally obtain a desired operational behavior. For example, in some illustrative embodiments, the logic element may be programmed or adjusted so as to exhibit a P-type functional behavior in one non-volatile device state and may exhibit an N-type functional behavior when programmed or adjusted into another non-volatile device state. For example, in some illustrative embodiments, the polarization states of a respective material may be exploited in order to adjust the respective non-volatile device states.

Consequently, when selecting a hardware configuration required for performing a certain task, for instance, performing a logic function required for responding to a certain input, one or more of the programmable logic elements of the present disclosure may be programmed into a respective state, i.e., a respective functional behavior, so as to achieve the desired response, for instance, providing a certain digital or analog output signal. The programming or adjustment of the logic element may be accomplished in a substantially dynamic manner, i.e., upon programming or reprogramming the logic element during operation of the entire electronic device, wherein a relatively moderate dynamic response time may be achieved upon establishing a desired hardware configuration, since time periods for programming or reprogramming of the logic elements are typically milliseconds and significantly less. On the other hand, a static configuration of the hardware section may be achieved due to the non-volatile nature of the logic element, so that, contrary to many conventional approaches, the desired hardware configuration is available immediately after repowering the respective electronic device, including the programmable logic element.

In some illustrative embodiments, a desired programmable or adjustable functional behavior of the logic element may be accomplished on the basis of a combination of ferroelectric transistors of P-type and N-type, wherein the threshold voltage of these devices may be adjusted in a non-volatile manner by inducing a certain polarization state of the ferroelectric transistors. In illustrative embodiments, a combination of these ferroelectric transistors may be accomplished within or above the active semiconductor material and in one or more levels of a respective metallization system, thereby avoiding the necessity of providing an additional contact regime. In this manner, a contact element based on two transistor elements with ferroelectric characteristics may be obtained on the basis of an area consumption that may be comparable to the area consumption of two individual transistor elements, for instance, formed on the basis of CMOS techniques, thereby providing enhanced logic density compared to conventional strategies.

FIG. 1A is a schematic cross-sectional view of a field effect transistor element 150, hereinafter simply referred to as a transistor element 150, having an N-type functional behavior. That is, the transistor element 150 may comprise a channel region 152, with mainly negative charge carriers 157N and may form a conductive channel between respective channel terminals 156, 155, respectively. For convenience and as discussed above, the respective channel terminals 156, 155 may also be referred to as source/drain regions, wherein the respective function as a source or a drain may depend on the overall configuration in which the transistor element 150 may be used. The conductive state of the channel region 152, which is typically provided within an appropriately doped or non-doped semiconductor material 151, may be controlled by a control electrode 160, typically referred to as a gate electrode. The gate electrode 160 may be connected to an appropriate control voltage by means of a gate terminal 165. In order to achieve the required control function of the gate electrode 160, it may typically comprise a conductive material 161, also referred to herein as electrode material, which may be provided in the form of a highly doped semiconductor material, metal-containing materials or any combination thereof, depending on the overall device configuration. Moreover, a dielectric material 163 may be provided so as to electrically isolate the electrode material 161 from the channel region 152, wherein frequently well-established dielectric materials, such as silicon dioxide, silicon nitride, silicon oxynitride and the like, may be used with appropriate thickness in order to provide in combination with the electrode material 161 the desired functional behavior. In sophisticated applications, a high-k dielectric material may be frequently used in combination with or instead of well-established dielectric materials, wherein a high-k dielectric material is to be understood as a material having a dielectric constant of 10 or higher. Frequently, standard dielectric materials, such as silicon dioxide, silicon nitride and silicon oxynitride may be used in combination with a high-k dielectric material so as to establish a physical thickness of the dielectric material that is appropriate for maintaining leakage currents at a low level, while still providing superior capacitive coupling between the electrode material 161 and the channel region 152. For example, a high-k dielectric material on the basis of hafnium oxide is one of many appropriate candidates for implementing a high-capacitive structure or enhanced transistor operation.

A polarizable material 162, however, may be provided with appropriate thickness and position, for instance, immediately above the dielectric material 163 or as a portion of the dielectric material 163, wherein the polarizable material 162 has an appropriate lattice structure having at least two different configurations so as to respond differently to differently oriented external electric fields. For example, many ferroelectric materials may form crystals with elemental cells with two optional positions of one or more atoms in the cell, thereby exhibiting a different polarized state depending on the respective lattice sites. That is, upon applying an external electric field of sufficient strength, substantially all of the respective basic cells may transit into one of the two optional states, thereby, in total, resulting in a respective polarization. On the other hand, upon inverting the external electrical field, substantially all of the respective elemental cells may occupy the other lattice configuration, thereby representing a state of inverse polarization. For example, materials on the basis of hafnium oxide may frequently be used as polarizable material at or within the dielectric material 163. The programming of a desired polarized state may then be accomplished by applying a sufficiently high voltage to the gate electrode structure 160 and one or both of drain and source regions 153, 154 and/or the base material 151.

In FIG. 1A, it is assumed that the polarizable material 162 has been exposed to an external electric field of sufficient strength so as to substantially polarize any elemental cells in the corresponding direction and also align substantially all of the microscopic domains of similar polarization with respect to the external field, thereby forming a polarized state 164A that results in attraction of the negative charge carriers 157N within the channel region 152. For an N-type transistor, such as the transistor 150, the polarization state 164A may, therefore, result in superior conductivity of the channel region 152 for a moderately low voltage applied to the gate electrode 160 compared to a state in which substantially no polarization may be present, for instance, due to a substantially equal number of elemental cells being in one polarized state and elemental cells being in the opposite polarization state. A corresponding shift of conductivity of the channel region 152 may typically be expressed by a shift of a respective threshold voltage. The threshold voltage is typically a corresponding gate/drain voltage, at which conductivity may build up in the channel region 152, resulting in an increase of a source/drain current when connected to an appropriate voltage, such as the operating voltage of the transistor 150. It should be appreciated that during normal operation, i.e., during an operational phase, in which respective voltages are reliably below a level that is required for causing a change of the polarization state, the polarization state 164A may substantially be preserved so that the associated threshold voltage is also maintained, even if switching off the supply voltage and repowering a corresponding device with the normal operating voltage at any later stage.

Figure 1B:
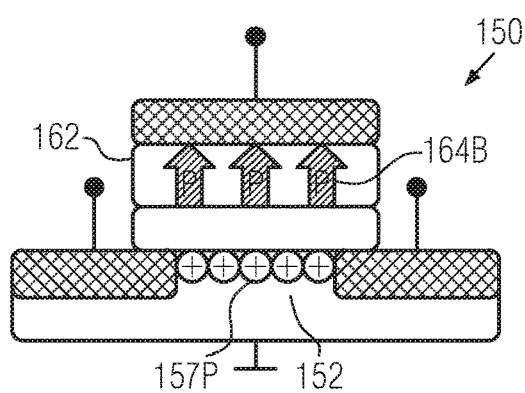
FIG. 1B schematically illustrates a cross-sectional view of the transistor element in the inversely polarized state.

FIG. 1B schematically illustrates a cross-sectional view of the transistor element 150, wherein an inverse polarization state 164B may have been established at any appropriate point in time. As discussed above, to this end, an external electric field may be applied to the polarizable material 162, which is typically accomplished on the basis of a voltage that is significantly higher than the normal operating voltage, as discussed above. The inverse polarized state 164B may result in repulsing the negative charge carriers 157N (FIG. 1A), while movable positive charge carriers and/or stationary positive charge carriers 157P may impart reduced conductivity to the channel region 152 for a given gate voltage. That is, in the configuration as shown in FIG. 1B, inset of a significant source/drain current may occur at a higher gate voltage compared to a substantially non-polarized state of the material 162 or compared to the inversely polarized state 164A. Consequently, a corresponding threshold voltage for the configuration of FIG. 1B may be significantly higher, thereby obtaining a significantly different operational behavior of the transistor element 150 when operated at normal supply voltage.

Figure 1C:
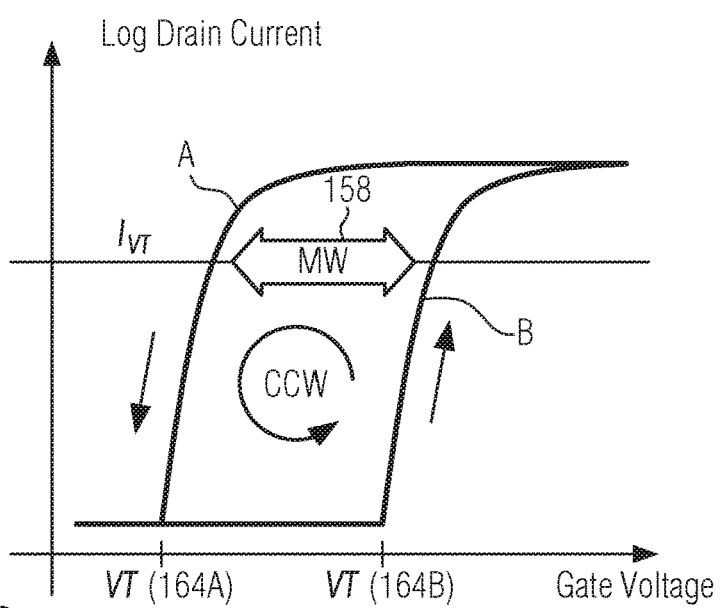
FIG. 1C schematically illustrates a typical functional behavior of the transistor element of FIGS. 1A and 1B in the respective polarized states in a substantially idealized manner.

FIG. 1C schematically illustrates an idealized functional behavior of the transistor element 150, wherein curve A represents the response of the drain current of the device 150 upon increasing the gate voltage. As discussed above, a threshold voltage corresponding to the polarized state 164A may result in an increase of the drain current when the gate voltage reaches the respective threshold voltage value. Further increase of the gate voltage may result in a further significant increase of the drain current, wherein finally a substantially saturated drain current is reached. On the other hand, when considering the polarization state 164B, the respective threshold voltage will be significantly higher, so that, upon increasing the gate voltage, a significant increase of drain current will be observed at the increased threshold voltage with the drain current further increasing upon increasing the gate voltage, thereby finally obtaining the saturated drain current value. The difference of the threshold voltages and, thus, of the functional behaviors of the transistor elements 150 may be advantageously used to store a bit of information in the transistor element 150. That is, when operating the transistor 150 on the basis of a normal operating voltage and using a gate voltage that may lie between the interval defined by the threshold voltage corresponding to the polarization state 164A and the threshold voltage associated with the polarization state 164B, the transistor 150 may respond differently to switching on and off the corresponding gate voltage. For example, when being in the high threshold voltage state indicated by curve B, a logic "1" of the gate voltage, i.e., a gate voltage between the two different threshold voltages, may result in substantially no drain current, while when being in polarization state 164A as indicated by curve A, the transistor element 150 would respond by a moderately high drain current.

Consequently, upon applying a programming electric field, the threshold voltage may be shifted between the two values associated with the polarization states 164A and 164B, respectively, wherein the difference of these threshold voltages may thus define a device characteristic, also referred to as "memory window" (MW), which allows the non-volatile storage of one bit of information. The memory window, indicated herein as 158, may thus represent a figure of merit of the device 150 and may also represent a criterion for estimating reliability, since any fluctuations of device characteristics may be accommodated by an appropriate width of the memory window 158. That is, the threshold voltages of the transistor element 150 may be determined by the overall transistor characteristics, such as transistor dimensions, materials, dopant concentrations and, in particular, characteristics of the polarizable material 162. By selecting the target design so as to obtain a relatively wide memory window 158, respective fluctuations in any of these transistor characteristics may not negatively affect the operation of the device 150, since, for a relatively wide memory window, a reliable distinction between the low threshold state and the high threshold state may still be guaranteed.

Figure 1D:
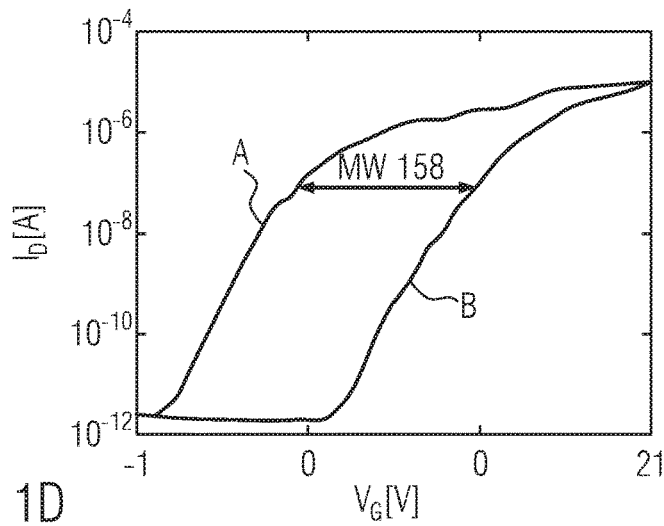
FIG. 1D schematically illustrates a graph representing the functional behavior of a typical ferroelectric transistor element formed on the basis of well-established manufacturing techniques based on a gate length of approximately 30 nm, wherein the drain currents for two different polarized states are illustrated.

FIG. 1D schematically illustrates a graph of the functional behavior of a ferroelectric transistor element formed on the basis of presently available manufacturing techniques, for instance, by implementing a transistor in a silicon base material, applying an SOI (silicon or semiconductor-on-insulator) architecture or a bulk architecture, with a gate length of approximately 30 nm. On the other hand, other device features may be substantially similar to respective transistor characteristics of non-ferroelectric CMOS transistor elements, wherein, for instance, hafnium oxide-based material may be used within the gate electrode, as previously discussed in the context of FIG. 1A, in order to provide differently polarized states. Curve A of FIG. 1D represents the drain current in Ampere for a respective device that is in a polarized state for obtaining a low threshold voltage, as discussed above. On the other hand, curve B indicates the drain current for a polarized state corresponding to a high threshold voltage state, as discussed above, wherein it is evident that, for instance, using a supply voltage of approximately 1 volt as a normal operating voltage, a memory window 158 in the order of magnitude of the operating voltage may be obtained. Consequently, well-established CMOS manufacturing techniques may be used in fabricating ferroelectric transistor elements having a desired wide memory window so as to reliably establish two different transistor states for storing therein a bit of information.

According to the present disclosure, it has been recognized that the basic operational behavior of a non-volatile storage transistor element, such as a ferroelectric transistor element, may be used so as to perform normal transistor operation and additionally store information therein, if required, wherein information storage is accomplished in a non-volatile manner. Since normal transistor operation may be difficult to achieve on the basis of a variable threshold voltage, i.e., a change between low threshold state and the high threshold state, respectively, depending on the desired memory state, in a reliable manner, according to illustrative embodiments disclosed herein, a logic element may be constructed so as to combine an N-type behavior with a P-type behavior, while additionally implementing the non-volatile functional behavior, for instance, based on different polarization states, as discussed above, thereby enabling the adjustment or programming of the basic functional behavior while additionally providing the possibility of storing the corresponding configuration in a non-volatile manner.

Figure 2A:
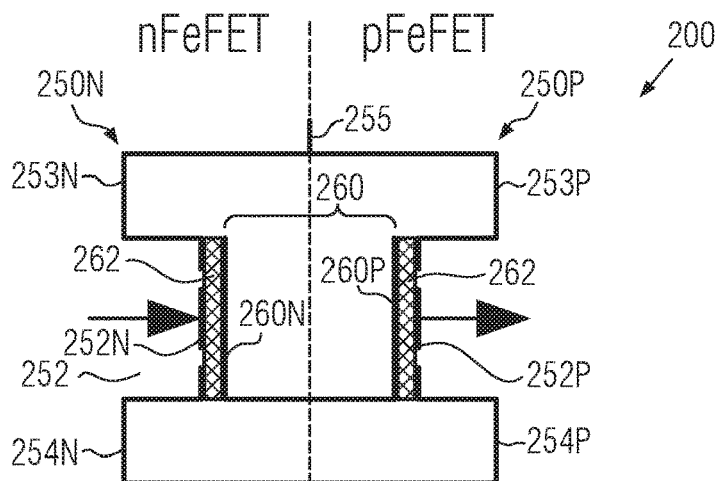
FIG. 2A is a schematic symbolic representation of a logic element with programmable or adjustable functional behavior, for instance, based on a ferroelectric material, wherein the logic element may exhibit transistor-like characteristics in accordance with illustrative embodiments.

FIG. 2A schematically illustrates a symbolic representation of a logic element 200, which may represent a transistor-like circuit element comprising a channel region 252, which, in some illustrative embodiments, may be formed from two different channel regions 252P, 252N representing the respective channel regions of a P-type transistor element 250P and an N-type transistor element 250N, respectively. Furthermore, the logic element 200 may comprise a first channel terminal 255 connected to the channel region 252 at one end thereof and a second channel terminal 256 connected to the channel region 252 at the other end thereof. In one illustrative embodiment, the first channel terminal 255 may represent a terminal connecting to a drain/source region 253P and a drain/source region 253N of the P-type transistor element 250P and the N-type transistor element 250N, respectively. Similarly, the second channel terminal 256 may represent any type of connection to respective source/drain regions 254P, 254N of the P-type transistor element 250P and the N-type transistor element 250N, respectively.

Moreover, the device 200 may comprise a control electrode 260 appropriately configured and positioned to control current flow in the channel region 252. In one illustrative embodiment, the control electrode 260 may represent respective gate electrodes 260P, 260N of the P-type transistor element 250P and the N-type transistor element 250N, respectively. Furthermore, in some illustrative embodiments, the control electrode 260 may comprise a mechanism for storing information, i.e., a mechanism for varying and holding a threshold voltage in a non-volatile manner, for instance, on the basis of a ferroelectric material 262. Moreover, it is to be noted that the control electrode 260, for instance, in the form of the two gate electrodes 260P, 260N, may further include any required components, such as a dielectric material, an electrode material and the like, as needed for appropriately controlling current flow in the channel region 252 upon applying a respective voltage at the control electrode 260.

Consequently, in some illustrative embodiments, the logic element 200 may be composed of the P-type transistor element 250P and the N-type transistor element 250N with their respective channel regions 252P, 252N electrically connected in parallel, for instance, by connecting in parallel the respective drain/source regions 253P, 253N and their respective source/drain regions 254P, 254N. Moreover, the gate electrodes 260P, 260N may be connected in parallel, for instance, by providing a common basic gate configuration for the transistor elements 250P, 250N. Therefore, the element 200 may respond to a respective gate voltage and an operating voltage applied to the terminals 260, 255, 256, respectively, in a transistor-like manner, wherein the functional behavior may be adjusted or programmed by using the mechanism supplied by the material 262.

Figure 2B:
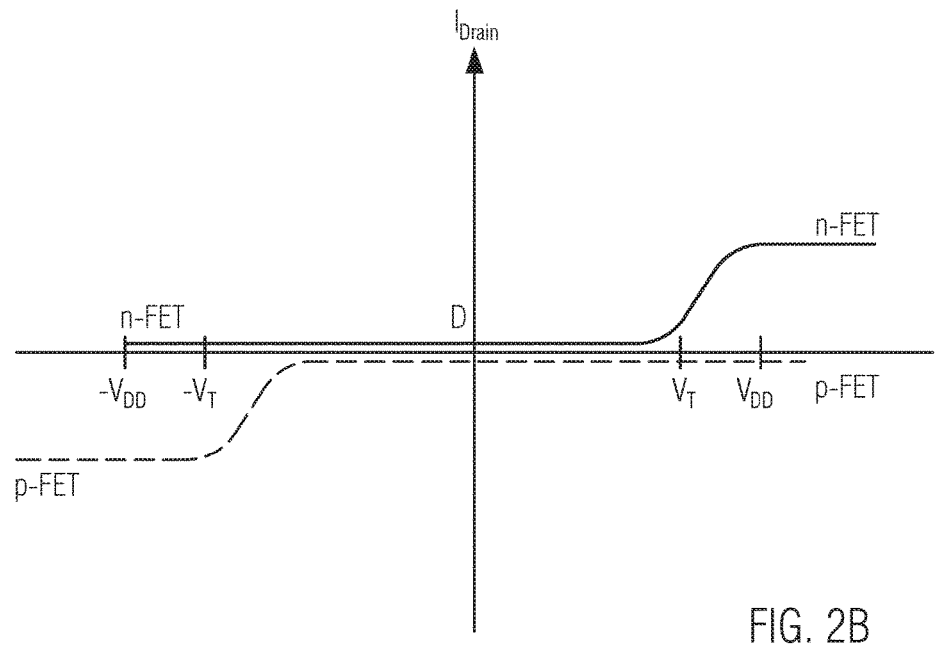
FIG. 2B schematically illustrates the functional behavior of the logic element of FIG. 2A in a substantially non-polarized state, thereby combining a P-type functional behavior and an N-type functional behavior according to illustrative embodiments.

FIG. 2B schematically illustrates a functional behavior in a schematic and idealized manner. That is, the vertical axis in FIG. 2B represents a corresponding drain flowing in the channel region 252 of the logic element 200 of FIG. 2A. For convenience, the respective current is also indicated as a drain current similar to the representation of FIG. 1C or 1D. The horizontal axis represents a "gate" voltage, i.e., a voltage applied to the control terminal 260, thereby commonly acting on the channel region 252, even if composed of the two channel regions 252P, 252N.

It should be appreciated that the gate voltage may be typically considered as a voltage applied between a gate electrode and a source terminal of a field effect transistor. In the present disclosure, for convenience, one of the channel terminals 255, 256, such as the terminal 255, may be considered as a "drain" terminal of the logic element 200, while the other one of the terminals 255, 256, i.e., the terminal 256, may be considered as a "source" terminal of the element 200. Since, in the embodiment illustrated in FIG. 2A the logic element 200 may include the P-type transistor element 250P and the N-type transistor element 250N with their respective channel terminals electrically connected with each other, it may be convenient to represent the gate voltage of the N-type transistor element 250N with a positive sign when applied as a positive voltage at the terminal 256, i.e., to the "source" region 254N, which may also be considered as a reference potential. On the other hand, when the potential at the terminal 256 is higher compared to the potential at the control electrode 260, i.e., the gate electrodes 260N, 260P, the respective gate voltage may have a negative sign. Similarly, a flow direction of current in the channel regions 252 may be considered positive with electrons flowing from the source region 254N to the drain region 253N and may be considered negative when the flow direction of negative charge carriers is from the drain region 253N to the source region 254N. The same holds true for a current flow direction in the channel region 252P. That is, flow of negative charge carriers from the "source" region 254P to the "drain" region 253P may be represented by a negative sign.

In the graph of FIG. 2B, it may be assumed that a substantially "neutral" state of the non-volatile storage mechanism may be established. For example, when considering a polarizable material, such as the material 262, the respective polarization states may be arbitrarily distributed in any spatial direction, thus, in particular, in the directions perpendicular to the respective channel regions as, for instance, illustrated in FIGS. 1A, 1B by the polarization states 164A, 164B, which represent polarization states oriented substantially perpendicular to the respective channel region 152. Moreover, it should be noted that the remaining characteristics of the logic element 200, for instance, the dimensions, material selection, dopant concentrations of the P-type transistor element 250P and the N-type transistor element 250N, may be selected so as to obtain a normal operating voltage of a specified value, indicated as VDD. Moreover, the respective threshold voltages in this substantially non-polarized state may be assumed to be, for instance, 0.8×VDD. Consequently, when considering the right-hand side of FIG. 2B, applying a positive voltage to the control electrode 260 may not result in substantially significant drain current as long as the supplied "gate" voltage is below the threshold voltage for the N-type transistor element 250N. On the other hand, for the P-type transistor elements 250P as discussed above, the respective threshold voltage may be positioned at approximately 0.8×VDD, however, at the negative side of the horizontal axis of FIG. 2B due to the convention for the sign of respective voltages, as discussed above. Moreover, in this case, it may be assumed that the respective threshold voltages of the P-type transistor elements 250P and the N-type transistor elements 250N are substantially symmetric, i.e., substantially equal to each other. Consequently, upon further increasing the "gate" voltage in the positive direction and finally reaching the threshold voltage of the N-type transistor element 250N, a significant increase of the drain current may be observed, as is typical for an N-type transistor element. On the other hand, the channel region of the P-type transistor element 250P may not contribute significantly to the drain current.

Upon reversing the "gate" voltage into the negative region, for instance, by inverting the potentials supplied to the terminals 255, 256, the N-type part of the logic element 200, that is, in the embodiment illustrated, the N-type transistor element 250N, may substantially not contribute to the total drain current in a significant manner, while, upon reaching the threshold voltage of the P-type part of the element 200, a corresponding significant increase of drain current in FIG. 2B in the negative direction, as discussed above, may be observed, thereby providing a substantially P-type functional behavior. Since a P-type functional behavior and an N-type functional behavior may be obtained within the range of the normal operating voltage VDD, depending on the specific polarity of the respective "drain/source" voltage, two respective jumps in the conductivity may be observed, which in many cases may be an undesirable characteristic. Therefore, in some illustrative embodiments, the non-volatile storage mechanism may be advantageously used to shift the respective threshold voltages so as to obtain a single threshold voltage value within the window of the normal operating voltage VDD, thereby providing the possibility of obtaining a P-type functional behavior or an N-type functional behavior, depending on the non-volatile memory mechanism, for instance, the polarization state of the material 262. That is, upon shifting the entire functional behavior of the logic element 200 to the left in FIG. 2B, the threshold voltage for the N-type functional behavior may be lowered, while at the same time, the threshold voltage for the P-type functional behavior may be shifted "out" of the available supply voltage window VDD. In other words, the threshold voltage of the P-type transistor element 250P may be shifted below the negative supply voltage, which may be referred to as the ground potential or which may be indicated in FIG. 2B according to the above-specified designation of voltages and their respective positive or negative sign, below −VDD. Similarly, the entire functional behavior may be shifted to the right so as to shift the threshold voltage of the N-type transistor element 250N so as to lie above VDD, thereby also shifting the threshold voltage of the P-type transistor 250P in the vicinity of the zero point, thus providing a substantially P-type behavior. Consequently, by appropriately shifting the respective threshold voltages, in some illustrative embodiments, only one threshold value within the corresponding VDD window may be effective, thereby obtaining a well-defined operational behavior of the logic element 200.

Figure 2C:
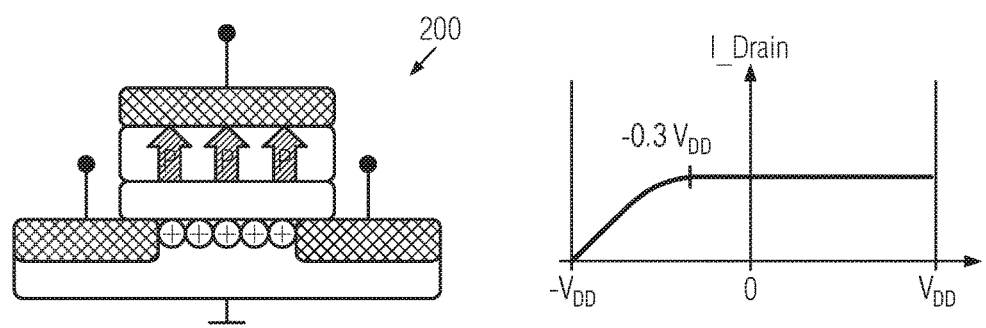
FIG. 2C schematically illustrates the functional behavior adjusted on the basis of a first polarization state, thereby substantially obtaining a P-type functional behavior of the logic element according to illustrative embodiments.

FIG. 2C schematically illustrates a schematic view of a corresponding polarization state of the logic element 200, when respective device characteristics may be adjusted to approximately the following values. The memory window, such as the window 158 (FIG. 1C), may be adjusted by means of any respective manufacturing processes, such as ion implantation or any other type of arranging a respective dopant concentration in relevant transistor areas, to approximately 1.0 VDD. Furthermore, the manufacturing process may be controlled so as to obtain a threshold voltage of approximately 0.8 VDD for both an N-type ferroelectric transistor element and a P-type ferroelectric transistor element, such as the transistor elements 250P, 250N. The threshold voltage of 0.8 VDD may correspond to a substantially neutral polarization state, i.e., to a substantially non-polarized state, which may also be referred to as the natural threshold voltages of the respective transistor elements. As a consequence, when starting from the substantially neutral polarization state and with a memory window of approximately 1.0 VDD, a corresponding shift of approximately 0.5 VDD may be achieved in either direction upon polarizing the respective polarizable material into a polarization state, in which substantially all of the elemental cells are polarized in one direction, as also discussed above. Similarly, a shift of the threshold voltages by approximately 0.5 VDD in the other direction may be achieved by programming the inverse polarization state.

FIG. 2C illustrates the polarization state of the logic element 200 in which a right shift in FIG. 2B is accomplished by approximately 0.5 VDD, thereby shifting the threshold voltage of the N-type transistor element 250N above the operating voltage VDD. Consequently, as indicated in FIG. 2C, the finally obtained threshold voltage for the N-type transistor element 250N for the polarization state as shown, also referred to as a first polarization state, is approximately 1.3 VDD, while the threshold voltage for the P-type transistor element 250P may be shifted to approximately −0.3 VDD. The corresponding transistor characteristic, i.e., the drain current with respect to the "gate" voltage, is illustrated on the right hand side of FIG. 2C. As is evident, the resulting configuration represents the transistor behavior of a P-type transistor element with a threshold voltage at −0.3 VDD, while the corresponding threshold voltage of the N-type transistor element 250N is above VDD, i.e., to the right of the positive branch of the VDD window in FIG. 2C.

Figure 2D:
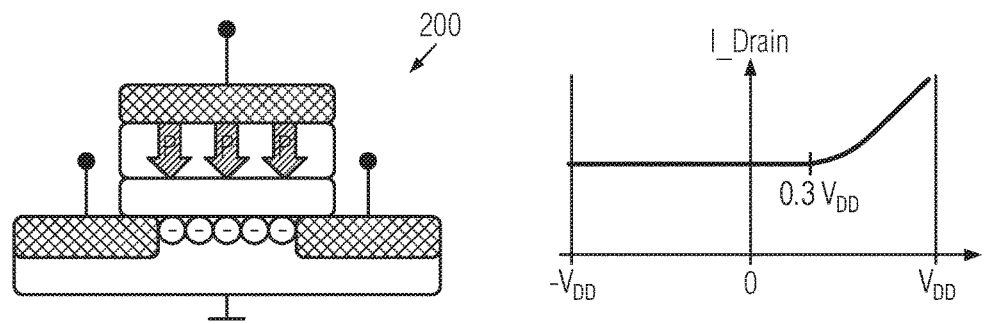
FIG. 2D schematically illustrates a second polarized state that is inverse to the first polarized state, thereby achieving a substantially N-type functional behavior of the logic element according to illustrative embodiments.

FIG. 2D schematically illustrates the logic element 200 in the polarization state that is inverse to the polarization state shown in FIG. 2C, wherein this inverse polarization state may be referred to as a second polarization state. In this case, when referring to FIG. 2B, the functional behavior may be shifted to the left, thereby shifting the threshold voltage below the negative supply voltage, wherein it should be appreciated that a negative supply voltage may correspond to a reversal of the voltages of the drain and source regions or channel terminals 255, 256 of the element 200, as discussed above, while, on the other hand, the threshold voltage of the N-type transistor element 250N is shifted to approximately 0.3 VDD. In this case, a well-defined transistor behavior is also obtained within the VDD window, which corresponds to the functional behavior of an N-type transistor.

As a consequence, the logic element 200 may be used as a P-type transistor element or as an N-type transistor element, depending on the polarization state of the material 262 (FIG. 2A), wherein the corresponding functional behavior may be preserved in a non-volatile manner due to the characteristics of the respective polarizable material 262. Therefore, when configuring a logic block or any other circuit block that currently requires the functional behavior of a P-type transistor element, at any appropriate time the polarization state of the logic element 200 may be selected, for instance, by applying an appropriate programming voltage in order to establish the desired polarization state. It should be appreciated that the corresponding programming voltage may typically be significantly higher than the normal operating voltage VDD so that the polarization state, once established, may not be substantially affected by the normal operation of the transistor element. On the other hand, when the functional behavior of an N-type transistor element is required for a certain digital or analog circuit block, the corresponding inverse or second polarization state may be established upon applying the programming voltage with inverse polarity, which may then also be preserved throughout the normal operation of the logic element 200.

As a consequence, upon establishing a certain hardware configuration for a specific circuit block by adjusting the respective polarization states, a desired operational behavior of the circuit block under consideration may be accomplished without requiring a reestablishment of this state upon repowering the circuit block, as may typically be the case in conventional programmable hardware configurations. Therefore, significantly reduced amount of control overhead may suffice when using reconfigurable logic elements, such as the logic element 200, and exploiting the non-volatile storage character thereof.

Figure 3A:
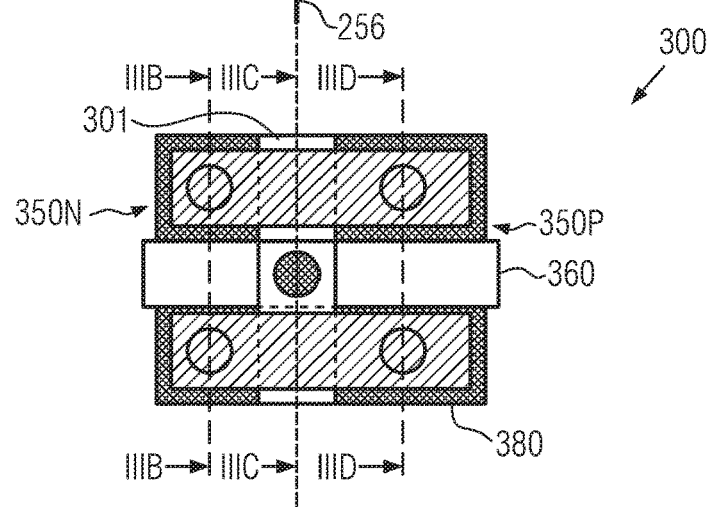
FIG. 3A schematically illustrates a top view of a logic element, including a P-type transistor structure and an N-type transistor structure that are electrically connected so as to establish a single logic element having a substantially transistor-like functional behavior that is programmable or adjustable according to illustrative embodiments.

FIG. 3A schematically illustrates a top view of a typical hardware configuration of a logic element 300, which may substantially comprise the same functional behavior as described above with reference to the logic element 200 described and discussed in the context of FIGS. 2A-2D. As illustrated, the logic element 300 may comprise a P-type transistor element 350P and an N-type transistor element 350N, which may be separated by an appropriate isolation structure 301, while any electrical connections required for forming the logic element 300 may be established by a portion of a contact and metallization level 380.

Figure 3B:
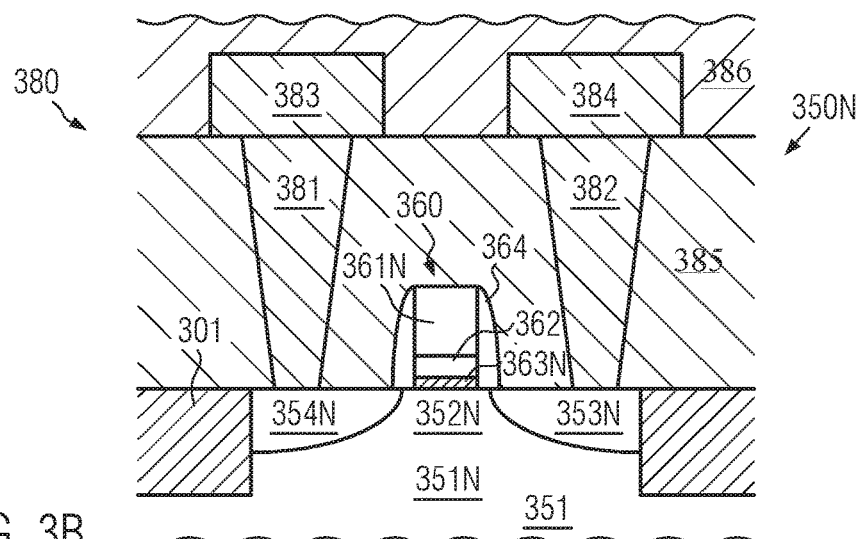
FIGS. 3B-3D schematically illustrate respective cross-sectional views of the logic element of FIG. 3A corresponding to the respective sections IIIB, IIIC and IIID according to still further illustrative embodiments.

FIG. 3B schematically illustrates a cross-sectional view along the section indicated as IIIB in FIG. 3A, thereby depicting a cross-sectional view of the N-type transistor element 350N. As illustrated, a substrate may be provided, wherein, for convenience, a basic semiconductor material thereof, indicated as 351, may be formed so as to accommodate respective functional areas of the transistor element 350N. The basic material 351 may represent any appropriate semiconductor material, such as silicon, germanium, silicon/germanium, III-V semiconductors or any combination thereof. In the basic material 351, appropriate semiconductor regions having an appropriate dopant concentration and profile may be provided so as to form respective types of transistor elements. For example, a semiconductor region 351N, which may also be referred to as a well region, may be provided so as to be appropriate for the N-type transistor element 350N.

It should be appreciated that the illustration of the transistor element 350N is highly schematic in that a plurality of different transistor architectures may be used, depending on the overall technology node to be applied in forming a respective semiconductor device. For instance, the region 351N may represent the well region of a transistor formed in accordance with a bulk architecture, in which a respective PN junction (not shown) delineates the region 351N from the lower-lying basic material 351. In other cases, an SOI architecture may be used, in which the delineation of the region 351N in the depth direction, i.e., the vertical direction in FIG. 3B, may be accomplished by a buried insulating material (not shown). In even more sophisticated cases, a corresponding SOI architecture may be provided in the form of a so-called "fully depleted configuration," in which a moderately thin semiconductor layer may be provided as the region 351N, which may have no or substantially no doping in order to provide a substantially depleted channel region 352N in certain operating conditions. In this case, respective source and drain regions 354N, 353N may extend down to the corresponding buried insulating material, while the channel region 352N may also substantially extend down to the buried insulating layer. It should be appreciated that such fully depleted transistor architectures may be typically used in sophisticated applications, in which high performance at low power consumption is required. Moreover, in other transistor architectures, the substantially planar configuration as used for the transistor elements 350N, 350P may be replaced by a so-called "three-dimensional architecture," in which two or more channel regions may be provided in a folded geometry controlled by a respective gate structure. For example, such three-dimensional transistors may be frequently referred to as fin-type field effect transistors.

Moreover, the gate electrode structure 360 may be provided so as to allow efficient control of the channel region 352N, as has also been previously discussed. To this end, the gate electrode structure 360 may comprise an electrode material 361N, which may represent any appropriate doped semiconductor material and/or specifically designed metal-containing materials and the like. Moreover, a dielectric layer 363N may separate the gate electrode structure 360 from the underlying channel region 352N. The material composition and the geometric thickness of the dielectric material 363N, possibly in combination with a polarizable material 362, and in combination with the electronic characteristics of the material 361N, may be appropriately selected so as to obtain the desired controllability of the channel region 352N upon applying a specific voltage to the gate electrode structure 360.

For example, in sophisticated applications, the dielectric layer 363N may be designed so as to exhibit a relatively high capacitance, which may be typically accomplished by reducing a thickness thereof, while, in other cases, a desired minimum thickness may be maintained so as to reduce leakage currents that may be caused by charge carriers having sufficient energy for entering the dielectric material 363N or even penetrating through this material. For example, well-established high-k dielectric materials, possibly in combination with a thin layer of conventional dielectric materials, may be used in sophisticated applications. In still other cases, silicon dioxide, silicon nitride, silicon oxynitride and the like may be used, substantially without using sophisticated high-k dielectric materials. Similarly, the polarizable material 362 may be implemented with appropriate material composition and thickness in order to provide the non-volatile storage characteristics upon adjusting a desired polarization state of the material 362, as previously discussed. For example, hafnium oxide-based materials may be frequently used for this purpose, since these materials may also be used in the context of high-k dielectric gate layers and, therefore, a plurality of process techniques have been established for depositing and patterning respective material layers.

The gate electrode structure 360 may further comprise sidewall spacers 364, for instance, formed of any appropriate dielectric material in compliance with overall device requirements.

The transistor element 350N may further comprise a contact level as part of the overall metallization structure 380, wherein one or more dielectric materials 385 may substantially enclose and thus passivate any components of the transistor element 350N formed in and above the base material 351. For example, silicon dioxide, silicon nitride and the like may be frequently used for the dielectric material 385. Metal-containing contact elements 381, 382 may be provided and may represent respective source and drain terminals or channel terminals connecting to the source and drain regions 354N, 353N, respectively. The contact elements 381, 382 may be formed on the basis of any appropriate metal-containing material so as to comply with the overall device requirements. Additionally, the structure 380 may comprises one or more additional metallization layers, wherein, in some illustrative embodiments, a first metallization layer may be represented by an appropriate dielectric material 386, which may be provided in the form of a low-k dielectric material or any other appropriate dielectric material, in combination with respective metal lines 383, 384. The metal lines 383, 384 may be provided in the form of a highly conductive metal, such as aluminum, copper, copper alloy and the like.

Figure 3C:
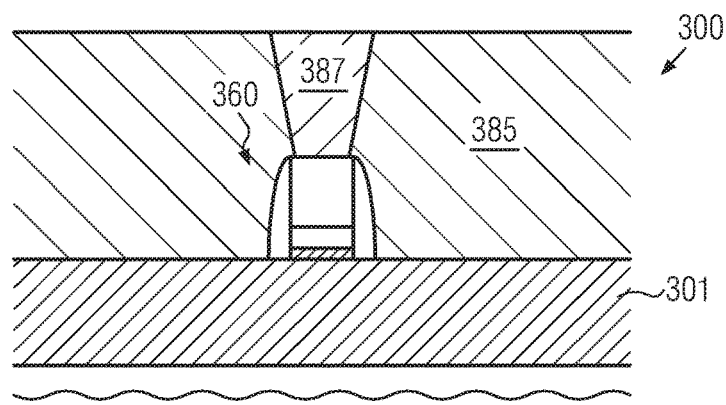

FIG. 3C schematically illustrates the logic element 300 in cross-sectional view according to the section IIIC of FIG. 3A. As illustrated, the gate electrode structure 360 may be formed on the isolation structure 301 and may therefore act as a connecting base material between the gate electrode structures of the transistor elements 350N and 350P, as illustrated in FIG. 3A. Furthermore, a contact element 387 may be formed within the dielectric material 385 and may connect to the gate electrode structure 360.

Figure 3D:
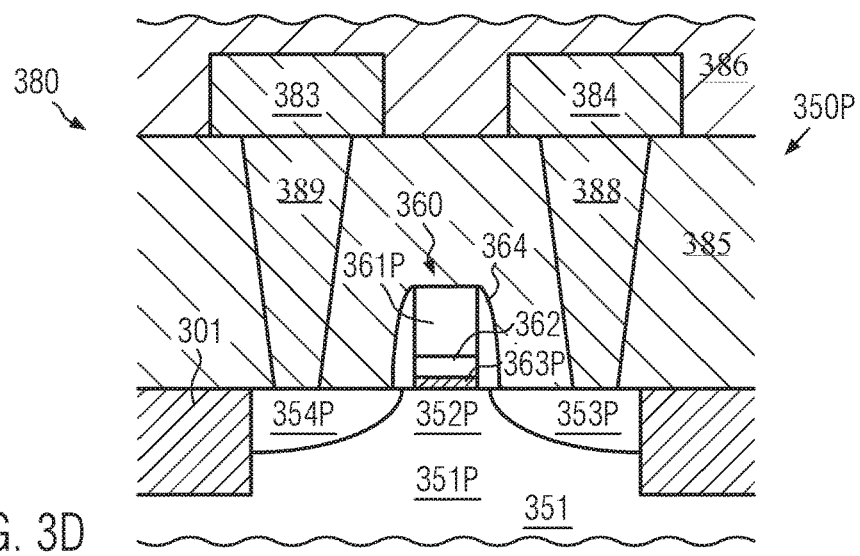

FIG. 3D schematically illustrates a cross-sectional view of the P-type transistor element 350P along the section IIID in FIG. 3A. Basically, the P-type transistor element 350P may have a similar configuration as the transistor element 350N, wherein, however, the type of doping may be typically inverted compared to the respective doped areas of the transistor element 350N. Moreover, the overall lateral dimensions in the transistor width direction, i.e., in FIG. 3A, the horizontal direction, may be different for the two types of transistor elements. Thus, the transistor element 350P may comprise a corresponding semiconductor region 351P formed on the base material 351 so as to exhibit the required characteristics with respect to dopant concentration and dopant profile, as also discussed above with respect to the region 351N. Further, source and drain regions 354P, 353P may be provided so as to laterally enclose a channel region 352P, which, in turn, may be controlled on the basis of the gate electrode structure 360, which may have basically the same configuration as the gate electrode structure 360 of the transistor element 350N, except for some components, such as the electrode material 361P and the gate dielectric layer 363P in sophisticated applications. For instance, the material 361P may be a highly doped semiconductor material, wherein the type of dopant may differ from the type of dopant in the gate electrode structure 360N of the transistor element 350N. Similarly, if sophisticated high-k dielectric materials are considered, the dielectric layer 363P may have a material composition which may differ from the material composition of the dielectric layer 363N of the transistor element 350N.

Moreover, the dielectric layer 385 may be provided so as to enclose and passivate any further transistor components, wherein the source and drain regions 354P, 353P may be contacted by respective contact elements 389, 388, respectively. Moreover, the metal lines 383, 384 may be provided in the dielectric material 386 so as to connect to the corresponding contact elements 389, 388, respectively.

As is evident from FIGS. 3A-3D, the gate electrode structure 360 may be provided as a substantially continuous structure, wherein the composition of at least some portions may differ for the transistor elements 350P, 350N, thereby providing a common control mechanism for the respective channel regions 352N, 352P. Similarly, the regions 354N and 354P, on the one hand, and the regions 353N and 353P, on the other hand, are electrically connected with each other, thereby electrically connecting in parallel the respective channel regions 352N, 352P. That is, by means of the metal line 383, a respective voltage or potential may be applied to the corresponding "source" regions 354N, 354P so that the metal line 383 may be considered as a channel terminal of the device 300. Similarly, the "drain" regions 353N, 353P may receive a common voltage or potential by means of the metal line 384, which may therefore be considered as a further channel terminal of the element 300. Consequently, by applying a control voltage to the contact element 387 (FIG. 3C) and by supplying the normal supply voltage between the metal lines 383 and 384, the logic element 300 may be operated in a manner as discussed above with reference to FIGS. 2A-2D.

It should be appreciated that the semiconductor regions 351N, 351P may have to be connected in an appropriate manner to a respective reference potential, such as ground potential, depending on the overall transistor architecture. During application of a programming voltage between the gate electrode structure 360 and the source and drain regions and/or the respective semiconductor regions 351N, 351P, the polarization states of the material 362 may be adjusted commonly for the N-type transistor element 350N and the P-type transistor element 350P.

The logic element 300 as shown in FIGS. 3A-3D may be formed on the basis of the following processes. The base material 351 may be provided in the form of any appropriate substrate material or may be formed in accordance with well-established process techniques, such as epitaxial growth techniques and the like. The semiconductor regions 351N, 351P, if required, may be formed at any appropriate manufacturing stage, for instance, by performing an ion implantation process sequence and the like. Furthermore, the isolation structure 301, for instance, in the form of a shallow trench isolation, may be formed prior to or after providing the semiconductor regions 351N, 351P. To this end, well-established process techniques, such as forming a trench, filling the trench with appropriate dielectric materials and removing any excess materials, may be applied. Thereafter, the gate electrode structure 360 may be formed on the basis of well-established lithography and patterning strategies so as to obtain the desired lateral dimension of the structure 360 in accordance with overall device requirements. Depending on the complexity of the gate electrode structure 360, a respective process sequence may be required for forming one or more materials of the dielectric layers 363N, 363P, followed by the deposition and treatment of the material 362. Thereafter, any appropriate electrode material may be deposited and may be differently treated above the region 351P compared to the region 351N.

After the patterning of the resulting layer stack, respective implantation processes and/or epitaxial growth processes in combination with other processes, such as etch processes, may be applied in order to form the respective drain and source regions having the appropriate lateral and vertical dopant profile. It should be appreciated that, during the process of forming the semiconductor regions 351N, 351P and/or during the process of providing the desired lateral and vertical dopant profiles of the respective drain and source regions, the threshold voltage characteristics may typically also be adjusted. That is, in combination with the overall device dimensions, the transistor characteristics may be adjusted on the basis of respective dopant profiles, at least some of which may be defined on the basis of implantation processes, and may be appropriately applied so as to define the basic functional behavior, for instance, the respective threshold voltages of the transistor elements 350N, 350P and the corresponding range of applicable operating voltages. Similarly, the memory window for the different polarization states of the material 362 may be adjusted on the basis of certain processes, such as deposition, anneal techniques and the like, upon forming the material 362 in combination with the underlying dielectric layers 363N, 363P, respectively. To this end, any well-established process techniques may be used, as are also employed in corresponding CMOS manufacturing strategies.

Thereafter, the structure 380 may be formed, for instance, by depositing the one or more dielectric materials 385 and patterning the same so as to form openings for the corresponding contact elements 381, 382, 387, 388, 389, which may be subsequently filled with any appropriate conductive material. To this end, well-established deposition, patterning and planarization techniques are available, Thereafter, the dielectric material 386 may be formed and patterned so as to form respective trenches corresponding to the metal lines 383, 384, which may be filled with any appropriate material, such as copper and the like, which may be accomplished on the basis of well-established deposition techniques, such as electrochemical deposition and the like.

As a result, the present disclosure provides logic elements which may exhibit transistor-like functional behavior that is adjustable or programmable in a non-volatile manner. In illustrative embodiments disclosed herein, the logic element may be formed on the basis of a P-type ferroelectric transistor element and an N-type ferroelectric transistor element, which may be connected in parallel so as to provide a common control electrode and electrically parallel channel regions that may be contacted by respective channel terminals. The functional behavior of the channel regions may be commonly adjusted on the basis of a ferroelectric material provided in the gate electrode structures of the P-type and N-type transistor elements, wherein basic characteristics, such as respective threshold voltages of these transistor elements, may be adjusted on the basis of "mask" programmable strategies, such as implantation of dopant species on the basis of respective implantation masks so as to adjust, for instance, the respective threshold voltages for individual elements or entire functional blocks in accordance with overall process requirements.

On the other hand, a respective shift of threshold voltages may be achieved by adjusting a corresponding polarization state of a logic element by applying an appropriate programming voltage, wherein an established shift of threshold voltages may be preserved in a non-volatile manner. It should be appreciated that the "dynamic" shift of threshold voltages may be achieved by substantially fully polarizing the respective polarizable material, while, in other cases, an intermediate functional behavior may be adjusted by polarizing only a specific proportion of the polarizable material, thereby enabling a substantially continuous shift of the respective threshold voltages. For example, when referring to FIG. 2B, full polarization of a respective logic element, such as the element 200, 300, may result in a corresponding shift of the threshold voltages so as to position only one threshold voltage within the available VDD range, thereby inducing either a P-type behavior or an N-type behavior. In other cases, a partial polarization may result in a corresponding shift of threshold voltages, where one of the threshold voltages may be positioned at a first desired target value, while the other threshold voltage may be positioned at a second target value, for instance, closer to the operating voltage VDD, thereby providing a significantly different transistor-like operational behavior, if considered appropriate for certain digital or analog operations.

The corresponding adjustment or programming of the functional behavior of the logic element may, therefore, allow a configuration of a block of logic elements in accordance with specific requirements, wherein a corresponding reconfiguration may be achieved in a dynamic or static manner. In particular, a corresponding hardware configuration may be stored in a non-volatile manner on the basis of the logic elements themselves, without requiring any additional memory capacities, as are typically required in conventional approaches.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A programmable logic element, comprising
a P-type ferroelectric transistor element having a first gate terminal and first and second channel terminals; and
an N-type ferroelectric transistor element having a second gate terminal and third and fourth channel terminals, wherein said first gate terminal, said first channel terminal and said second channel terminal of said P-type ferroelectric transistor are electrically connected in parallel with said second gate terminal, said third channel terminal and said fourth channel terminal of said N-type ferroelectric transistor element, respectively, and wherein a first threshold voltage of said P-type ferroelectric transistor element and a second threshold voltage of said N-type ferroelectric transistor element are substantially symmetric to each other in a non-polarized state.

2. The programmable logic element of claim 1, wherein said logic element has a P-type functional behavior when said P-type transistor element and said N-type transistor element are in a first polarized state.

3. The programmable logic element of claim 2, wherein said logic element has an N-type functional behavior when said P-type transistor element and said N-type transistor element are in a second polarized state that is inverse to said first polarized state.

4. The programmable logic element of claim 3, wherein said first threshold voltage of said P-type ferroelectric transistor element in said non-polarized state is adapted to be shiftable to a level that is less than a negative supply voltage when said P-type ferroelectric transistor element is polarized into said second polarized state.

5. The programmable logic element of claim 4, wherein said first threshold voltage of said P-type ferroelectric transistor element in said non-polarized state is further adapted to be shiftable to a desired P-type operating threshold voltage when said P-type ferroelectric transistor element is polarized into said first polarized state.

6. The programmable logic element of claim 3, wherein said second threshold voltage of said N-type ferroelectric transistor element in said non-polarized state is adapted to be shiftable to a desired N-type threshold voltage when said N-type ferroelectric transistor element is polarized into said second polarized state.

7. The programmable logic element of claim 6, wherein said second threshold voltage of said N-type ferroelectric transistor element in said non-polarized state is further adapted to be shiftable above a positive supply voltage when said N-type ferroelectric transistor element is polarized into said first polarized state.

8. The logic element of claim 1, wherein said P-type ferroelectric transistor element and said N-type ferroelectric transistor element are provided in a semiconductor layer of a semiconductor device laterally separated from each other by an isolation structure.

9. A transistor type circuit element in a semiconductor device, the transistor type circuit element comprising:
a P-type ferroelectric transistor element that is adapted to have a first threshold voltage;
an N-type ferroelectric transistor element that is adapted to have a second threshold voltage, wherein said first and second threshold voltages are substantially symmetric to each other in a non-polarized state;
a channel region connecting at one end thereof to a first channel terminal and at a second end thereof to a second channel terminal; and
a control electrode formed so as to enable control of current flow through said channel region, wherein said transistor type circuit element is configured to have a threshold voltage that is adapted to be shiftable to a first value wherein said transistor type circuit element exhibits substantially P-type characteristic current flow behavior in said channel region and shiftable to a second value wherein said transistor type circuit element exhibits substantially N-type characteristic current flow behavior.

10. The transistor type circuit element of claim 9, wherein said transistor type circuit element is further adapted to enable shifting of said threshold voltage of said transistor type circuit element to said first and second values by establishing a first polarized state and a second polarized state, respectively, in said control electrode.

11. The transistor type circuit element of claim 9, wherein a first channel region of said P-type ferroelectric transistor element is connected in parallel to a second channel region of said N-type ferroelectric transistor element so as to form said channel region.

12. The transistor type circuit element of claim 9, wherein a first channel terminal and a second channel terminal of said P-type ferroelectric transistor element are connected in parallel to a first channel terminal and a second channel terminal of said N-type ferroelectric transistor element so as to form said first and second channel terminals of said circuit element.

13. The transistor type circuit element of claim 9, wherein said first threshold voltage of said P-type ferroelectric transistor element and said second threshold voltage of said N-type ferroelectric transistor element are shiftable beyond a negative and a positive operating voltage, respectively.

14. A method of operating a logic element, the method comprising:

connecting a P-type transistor element having a first threshold voltage and an N-type transistor element having a second threshold voltage in parallel, said first and second threshold voltages being substantially symmetric to each other in a non-polarized state;

operating said parallel-connected P-type transistor element and N-type transistor element on the basis of a common control signal; and adjusting a current characteristic of said parallel-connected P-type transistor element and said N-type transistor element by commonly shifting said first threshold voltage of said P-type transistor element and said second threshold voltage of said N-type transistor element.

15. The method of claim 14, wherein said current characteristic is adjusted in a non-volatile manner.

16. The method of claim 14, wherein adjusting said current characteristic comprises establishing a reconfigurable polarized state in said P-type transistor element and said N-type transistor element.

17. The method of claim 14, further comprising adjusting base values of said first and second threshold voltages by adjusting a dopant profile of said P-type transistor element and said N-type transistor element, respectively.

18. The method of claim 17, wherein a difference of said base values is adjusted to approximately 80 percent of a target operating voltage of a normal operation.

* * * * *